(12) United States Patent
Ino et al.

(10) Patent No.: US 12,160,994 B2
(45) Date of Patent: Dec. 3, 2024

(54) MEMORY DEVICE WITH FERROELECTRIC LAYER

(71) Applicant: Kioxia Corporation, Tokyo (JP)

(72) Inventors: Tsunehiro Ino, Fujisawa (JP); Akira Takashima, Fuchu (JP)

(73) Assignee: Kioxia Corporation, Tokyo (JP)

( * ) Notice: Subject to any disclaimer, the term of this patent is extended or adjusted under 35 U.S.C. 154(b) by 231 days.

(21) Appl. No.: 17/652,308

(22) Filed: Feb. 24, 2022

(65) Prior Publication Data

US 2023/0085754 A1 Mar. 23, 2023

(30) Foreign Application Priority Data

Sep. 17, 2021 (JP) .................................. 2021-151982

(51) Int. Cl.
*H10B 51/30* (2023.01)
*H01L 29/51* (2006.01)
*H01L 29/78* (2006.01)
*H10B 51/20* (2023.01)

(52) U.S. Cl.
CPC ........... *H10B 51/30* (2023.02); *H01L 29/516* (2013.01); *H01L 29/78391* (2014.09); *H10B 51/20* (2023.02)

(58) Field of Classification Search
CPC ............. H01L 29/78391; H01L 29/516; H01L 29/517; H01L 29/518; H10B 51/10; H10B 51/20; H01B 51/30
See application file for complete search history.

(56) References Cited

U.S. PATENT DOCUMENTS

| | | | | |
|---|---|---|---|---|
| 2010/0072535 | A1* | 3/2010 | Takashima | H01L 29/4234 257/324 |
| 2011/0049465 | A1* | 3/2011 | Nagashima | H01L 27/0688 438/653 |
| 2012/0243292 | A1* | 9/2012 | Takashima | H10N 70/245 257/4 |
| 2019/0296122 | A1 | 9/2019 | Ino et al. | |
| 2020/0091160 | A1* | 3/2020 | Ino | H10B 53/30 |
| 2020/0290865 | A1 | 9/2020 | Umeda et al. | |

FOREIGN PATENT DOCUMENTS

| | | |
|---|---|---|
| JP | 2019-169574 A | 10/2019 |
| JP | 2019-186691 A | 10/2019 |
| JP | 2020-9884 A | 1/2020 |

(Continued)

OTHER PUBLICATIONS

Fichtner, S. et al. "AlScN: A III-V semiconductor based ferroelectric", J. Appl. Phys. 125, 114103, 2019 , 19 pages.

(Continued)

*Primary Examiner* — Matthew E Warren
(74) *Attorney, Agent, or Firm* — Oblon, McClelland, Maier & Neustadt, L.L.P.

(57) ABSTRACT

A memory device according to an embodiment includes a semiconductor layer, a gate electrode layer, and a first dielectric layer provided between the semiconductor layer and the gate electrode layer. The first dielectric layer contains aluminum (Al), a first element, nitrogen (N), and silicon (Si). The first element is at least one element selected from the group consisting of scandium (Sc), yttrium (Y), lanthanoid (Ln), boron (B), gallium (Ga), and indium (In).

16 Claims, 7 Drawing Sheets

(56) References Cited

FOREIGN PATENT DOCUMENTS

| | | | | |
|---|---|---|---|---|
| JP | 2020-47796 A | 3/2020 | | |
| KR | 20060107071 A | * 10/2006 | ........... | H01L 29/517 |
| KR | 20140114536 A | * 9/2014 | ..... | H01L 21/823487 |
| WO | WO-2015129279 A1 | * 9/2015 | ........... | H01L 21/268 |

OTHER PUBLICATIONS

Yasuoka, S. et al. "Effects of deposition conditions on the ferroelectric properties of (Al1-x Scx)N thin films", Journal of Applied Physics 128, 114103, 2020, 19 pages.

Liu, X. et al. "Post-CMOS Compatible Aluminum Scandium Nitride/ 2D Channel Ferroelectric Field-Effect-Transistor", Cornell University, arXiv:2010.12062, 2020, 28 pages.

Mikolajick, T. et al. "Next generation ferroelectric materials for semiconductor process integration and their applications", Journal of Applied Physics 129, 100901, 2021, 22 pages.

Rassay, S. et al. "A Segmented-Target Sputtering Process for Growth of Sub-50 nm Ferroelectric Scandium-Aluminum Nitride Films with Composition and Stress Tuning", physica status solidi (RRL), Rapid Research Letters, vol. 15, Issue 5, 2100087, 2021, 6 pages.

Rassay, S. et al. (Abstract) "A Segmented-Target Sputtering Process for Growth of Sub-50 nm Ferroelectric Scandium-Aluminum-Nitride Films with Composition and Stress Tuning", physica status solidi (RRL), Rapid Research Letters, vol. 15, Issue 5, 2100087, 2021, 1 page.

* cited by examiner

MEMORY DEVICE WITH FERROELECTRIC LAYER

CROSS-REFERENCE TO RELATED APPLICATION

This application is based upon and claims the benefit of priority from Japanese Patent Application No. 2021-151982, filed on Sep. 17, 2021, the entire contents of which are incorporated herein by reference.

FIELD

Embodiments described herein relate generally to a memory device.

BACKGROUND

Memory devices using ferroelectrics have attracted attention as nonvolatile memory devices. An example of the memory devices is a three-terminal memory device having a metal ferroelectrics semiconductor (MFS) structure in which a gate insulating layer of a transistor corresponds to a ferroelectric layer. Further, another example of the memory devices is a two-terminal memory device such as a ferroelectric tunnel junction (FTJ) memory including a ferroelectric layer provided between two electrodes.

Such a memory device using a ferroelectric writes data into a memory cell by using polarization inversion of the ferroelectric. The polarization inversion occurs due to external application of an electric field to the ferroelectric.

DETAILED DESCRIPTION

A memory device of an embodiment includes a semiconductor layer, a gate electrode layer, and a first dielectric layer provided between the semiconductor layer and the gate electrode layer. The first dielectric layer contains aluminum (Al), a first element, nitrogen (N), and silicon (Si). The first element is at least one element selected from the group consisting of scandium (Sc), yttrium (Y), lanthanoid (Ln), boron (B), gallium (Ga), and indium (In).

Herein, the same or similar members are denoted with the same reference signs, and redundant description may be omitted.

Herein, a "ferroelectric" means a substance having spontaneous polarization without external application of an electric field and the polarization is inversed due to external application of an electric field. Further, herein, a "paraelectric" means a substance in which polarization occurs due to application of an electric field and the polarization disappears due to removal of the electric field. Furthermore, herein, a "coercive field" means the strength of an electric field in which polarization inversion occurs due to external application of the electric field to the ferroelectric.

Herein, "lanthanoid (Ln)" means at least one element of 15 elements from lanthanum (La) with atomic number 57 to lutetium (Lu) with atomic number 71.

Qualitative analysis and quantitative analysis of the chemical composition of members included in a memory device herein can be performed by, for example, secondary ion mass spectroscopy (SIMS), energy dispersive X-ray spectroscopy (EDX), electron energy-loss spectroscopy (EELS), Rutherford backscattering spectrometry (RBS), chromatography (IC), or atom probe tomography. Further, for example, a transmission electron microscope (TEM) can be used to measure the thickness of the members included in the memory device, the distance between the members, and the like. In addition to the above TEM, for example, convergent-beam electron diffraction (CBED), an X-ray diffraction method with radiation light, an X-ray diffraction method with a free electron laser such as SPring-8 Angstrom Compact Free Electron Laser (SACLA), Fourier transform infrared spectroscopy (FT-IR), or X-ray photoelectron spectroscopy (XPS) can be used to identify the crystal structure of such a member included in the memory device.

Hereinafter, embodiments of the present disclosure will be described with reference to the accompanying drawings.

First Embodiment

A memory device of a first embodiment includes a semiconductor layer, a gate electrode layer, and a first dielectric layer provided between the semiconductor layer and the gate electrode layer. The first dielectric layer contains aluminum (Al), a first element, nitrogen (N), and silicon (Si). The first element is at least one element selected from the group consisting of scandium (Sc), yttrium (Y), lanthanoid (Ln), boron (B), gallium (Ga), and indium (In).

Figure 1:
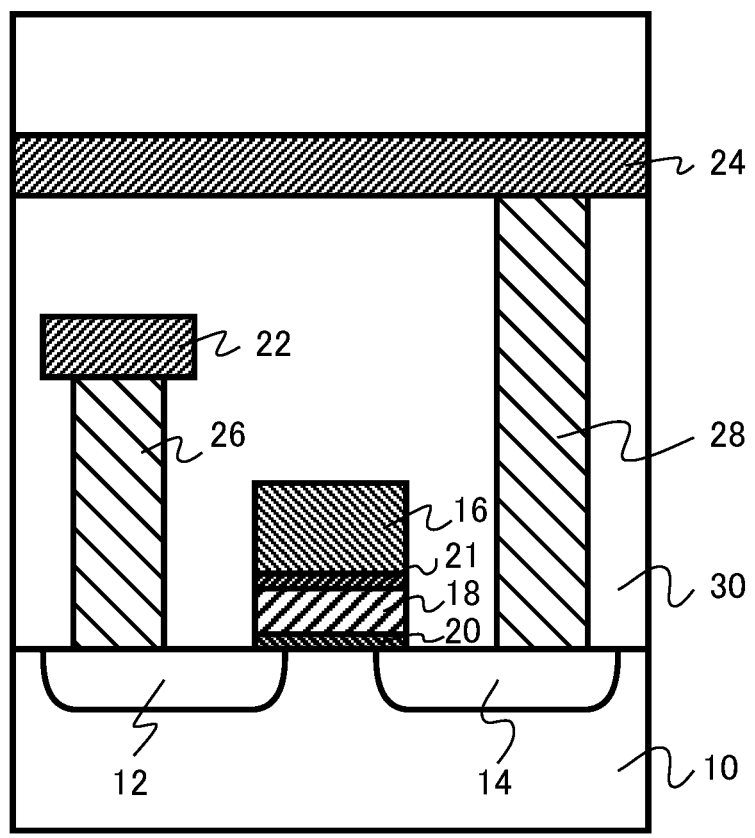
FIG. 1 is a schematic sectional view of a memory device of a first embodiment.

FIG. 1 is a schematic sectional view of the memory device of the first embodiment. The memory device of the first embodiment is a nonvolatile semiconductor memory device. The memory device of the first embodiment is a one-transistor (1T) memory device including a transistor having a metal ferroelectrics semiconductor (MFS) structure. The transistor having the MFS structure is Included in a memory cell of the memory device. The term MFS structure used here does not exclude a structure in which an insulating film is interposed, such as a metal ferroelectric insulator semiconductor (MFIS) structure or a metal insulator ferroelectric insulator semiconductor (MIFIS) structure, and thus means a structure in which a ferroelectric applies modulation to a channel for a transistor.

The memory device of the first embodiment includes a semiconductor layer 10, a source region 12, a drain region 14, a gate electrode layer 16, a ferroelectric layer 18, a first interface layer 20, a second interface layer 21, a source line 22, a bit line 24, a first contact plug 26, a second contact plug 28, and an interlayer insulating layer 30.

The ferroelectric layer 18 is an exemplary first dielectric layer. The first interface layer 20 is an exemplary second dielectric layer. The second interface layer 21 is an exemplary third dielectric layer.

The semiconductor layer 10 is, for example, single crystal silicon.

The source region 12 is provided in the semiconductor layer 10. The source region 12 is an n-type impurity region.

The drain region 14 is provided in the semiconductor layer 10. The drain region 14 is an n-type impurity region. The source region 12 and the drain region 14 may be each a p-type impurity region.

The gate electrode layer 16 is a metal or a semiconductor. The gate electrode layer 16 is, for example, titanium nitride. The gate electrode layer 16 is, for example, polycrystalline silicon containing n-type impurities or p-type impurities. The gate electrode layer 16 functions as a word line of the memory device.

The ferroelectric layer 18 is provided between the semiconductor layer 10 and the gate electrode layer 16. The ferroelectric layer 18 functions as part of a gate insulating layer.

The ferroelectric layer 18 is a ferroelectric.

The ferroelectric layer 18 contains aluminum (Al), a first element, nitrogen (N), and silicon (Si). The first element is at least one element selected from the group consisting of scandium (Sc), yttrium (Y), lanthanoid (Ln), boron (B), gallium (Ga), and indium (In).

Hereinafter, a case where the first element is scandium (Sc) will be described as an example.

The ferroelectric layer 18 contains, for example, aluminum (Al), scandium (Sc), nitrogen (N), and silicon (Si) as main components. That the ferroelectric layer 18 contains aluminum (Al), scandium (Sc), nitrogen (N), and silicon (Si) as main components means that no element having an atomic concentration higher than the aluminum (Al), the scandium (Sc), the nitrogen (N), or the silicon (Si) is present among the elements contained in the ferroelectric layer 18.

The atomic concentration of the Scandium (Sc) in the ferroelectric layer 18 is lower than the atomic concentration than the aluminum (Al) in the ferroelectric layer 18, for example. The atomic concentration of the scandium (Sc) in the ferroelectric layer 18 is, for example, equal to or more than 5% and equal to or less than 20%.

The atomic concentration of the Silicon (Si) in the ferroelectric layer 18 is lower than the atomic concentration of the aluminum (Al) in the ferroelectric layer 18, for example. Further, the atomic concentration of the silicon (Si) in the ferroelectric layer 18 is lower than the atomic concentration of the scandium (Sc) in the ferroelectric layer 18, for example. The atomic concentration of the silicon (Si) in the ferroelectric layer 18 is, for example, equal to or more than 1% and equal to or less than 10%.

The ratio (N/(Al+Sc+Si)) of the atomic concentration of the nitrogen (N) to the sum of the respective atomic concentrations of the aluminum (Al), the scandium (Sc), and the silicon (Si) in the ferroelectric layer 18 is, for example, equal to or more than 0.85 and equal to or less than 0.95.

The ferroelectric layer 18 contains, for example, a crystal containing aluminum (Al), scandium (Sc), nitrogen (N), and silicon (Si). The crystal containing aluminum (Al), scandium (Sc), nitrogen (N), and silicon (Si) is a crystal having a structure in which part of the aluminum site of aluminum nitride is substituted with scandium (Sc) and silicon (Si). Such a crystal having a structure in which part of aluminum site of aluminum nitride is substituted with scandium (Sc) and silicon (Si) is a wurtzite crystal.

For the crystal having the structure in which part of the aluminum site of aluminum nitride is substituted with scandium (Sc) and silicon (Si), the chemical composition can be represented by $(Al_{1-(x+y)}Sc_xSi_y)_pN_q$.

In the ideal case, p=q=1 for $(Al_{1-(x+y)}Sc_xSi_y)_pN_q$. In this case, the ratio (N/(Al+Sc+Si)) is 1. Therefore, when the above ratio (N/(Al+Sc+Si)) is less than 1, $(Al_{1-(x+y)}Sc_x Si_y)_pN_q$ contained in the ferroelectric layer 18 satisfies p>q, and nitrogen (N) is deficient from the ideal state that is, a state of stoichiometry.

The direction of the c-axis as the six-fold symmetry axis of the wurtzite crystal contained in the ferroelectric layer 18 falls within a range of ±10 degrees with respect to the direction connecting the semiconductor layer 10 and the gate electrode layer 16, for example. The wurtzite crystal contained in the ferroelectric layer 18 is, for example, c-axis oriented in the thickness direction of the ferroelectric layer 18.

The thickness of the ferroelectric layer 18 in the direction from the semiconductor layer 10 to the gate electrode layer 16 is, for example, equal to or more than 1 nm and equal to or less than 30 nm.

The first interface layer 20 is provided between the semiconductor layer 10 and the ferroelectric layer 18. The first interface layer 20 functions as part of the gate insulating layer. The first interface layer 20 contains, for example, a paraelectric. The first interface layer 20 is in contact with, for example, the semiconductor layer 10 and the ferroelectric layer 18.

The first interface layer 20 has, for example, a function of suppressing desorption of the nitrogen (N) from the ferroelectric layer 18. Further, the first interface layer 20 has, for example, a function of suppressing diffusion of the scandium (Sc) into the semiconductor layer 10.

The first interface layer 20 contains at least either silicon (Si) or nitrogen (N). The first interface layer 20 is, for example, nitride or oxynitride. The first interface layer 20 is, for example, silicon nitride, silicon oxynitride, aluminum nitride, or aluminum oxynitride.

The first interface layer 20 contains, for example, silicon (Si) and nitrogen (N).

The first interface layer 20 does not contain, for example, oxygen (O). The atomic concentration of oxygen in the first interface layer 20 is, for example, equal to or less than 1%.

The thickness of first interface layer 20 in the direction from the semiconductor layer 10 to the gate electrode layer 16 is thinner than the thickness of the ferroelectric layer 18 in the direction from the semiconductor layer 10 to the gate electrode layer 16. The thickness of the first interface layer 20 is, for example, equal to or more than 0.5 nm and equal to or less than 5.

Note that the first interface layer 20 may be omitted.

The second interface layer 21 is provided between the ferroelectric layer 18 and the gate electrode layer 16. The second interface layer 21 functions as part of the gate insulating layer. The second interface layer 21 includes, for example, a paraelectric. The second interface layer 21 is in contact with, for example, the ferroelectric layer 18 and the gate electrode layer 16.

The second interface layer 21 has, for example, a function of suppressing desorption of the nitrogen (N) from the ferroelectric layer 18. Further, the second interface layer 21 has, for example, a function of suppressing diffusion of the scandium (Sc) into the gate electrode layer 16.

The second interface layer 21 contains at least either silicon (Si) or nitrogen (N). The second interface layer 21 is, for example, nitride or oxynitride. The second interface layer 21 is, for example, silicon nitride, silicon oxynitride, aluminum nitride, or aluminum oxynitride.

The second interface layer 21 contains, for example, silicon (Si) and nitrogen (N).

The second interface layer 21 does not contain, for example, oxygen (O). The atomic concentration of oxygen in the second interface layer 21 is, for example, equal to or less than 1%.

The thickness of the second interface layer 21 in the direction from the semiconductor layer 10 to the gate electrode layer 16 is thinner than the thickness of the ferroelectric layer 18 in the direction from the semiconductor layer 10 to the gate electrode layer 16. The thickness of the second interface layer 21 is, for example, equal to or more than 0.5 nm and equal to or less than 5 nm.

Note that the second interface layer 21 may be omitted.

The source line 22 is electrically connected to the source region 12 through the first contact plug 26. The bit line 24 is electrically connected to the drain region 14 through the second contact plug 28. The source line 22, the bit line 24, the first contact plug 26, and the second contact plug 28 are each formed of, for example, a conductive metal or a conductive metal compound.

The interlayer insulating layer 30 is provided for electrically separating the semiconductor layer 10, the gate electrode layer 16, the source line 22, the bit line 24, the first contact plug 26, and the second contact plug 28. The interlayer insulating layer 30 is, for example, silicon oxide.

The memory cell of the memory device includes the semiconductor layer 10, the ferroelectric layer 18, and the gate electrode layer 16.

At the time of writing, the memory device changes the polarization direction of the ferroelectric layer 18 by application of a voltage between the gate electrode layer 16 serving as a word line and the semiconductor layer 10. At the time of reading, the memory device determines the data stored in accordance with the value of current flowing between the source line 22 and the bit line 24, that is, an on-current value of the transistor of the memory cell or a voltage value based on the on-current value.

The memory device controls the polarization state of the ferroelectric contained in the ferroelectric layer 18, with a voltage applied between the gate electrode layer 16 and the semiconductor layer 10. The threshold voltage of the transistor of the memory cell changes depending on the polarization state of the ferroelectric layer 18. Due to the change of the threshold voltage of the transistor of the memory cell, the on-current of the transistor of the memory cell changes.

For example, when a state in which the threshold voltage is higher and the on-current is lower is defined as data "0" and a state in which the threshold voltage is lower and the on-current is higher is defined as data "1", the memory cell can store one-bit data of "0" or "1". In addition, for example, control of the voltage applied to the gate electrode layer 16 such that the ferroelectric maintains four or more polarization states different in level allows the transistor of the memory cell to hold a plurality of threshold voltages. Holding the plurality of threshold voltages results in achievement of multi-leveling in which data of a plurality of bits is stored in the memory cell.

Note that FIG. 1 illustrates a case where a single memory cell is provided between the source line 22 and the bit line 24; however, for example, connecting a plurality of memory cells in series between the source line 22 and the bit line 24 enables formation of a NAND string like a NAND flash memory.

Next, an exemplary method of manufacturing the memory device of the first embodiment will be described.

First, a silicon nitride film is formed on a p-type single crystal silicon layer as an example of the semiconductor layer 10 by a chemical vapor deposition method (CVD method). The silicon nitride film is an example of the first interface layer 20.

The silicon nitride film suppresses desorption of the nitrogen (N) from the ferroelectric layer 18, for example, at the time of heat treatment during manufacturing of the memory device. The silicon nitride film serves as a supply source of silicon (Si) to the ferroelectric layer 18, for example, at the time of heat treatment during manufacturing of the memory device.

Next, the ferroelectric layer 18 is formed on the first interface layer 20 by an atomic layer deposition method. As the ferroelectric layer 18, a film containing aluminum (Al), scandium (Sc), nitrogen (N), and silicon (Si) as main components is formed by the ALD method.

Next, a silicon nitride film is formed on the ferroelectric layer 18 by the CVD method. The silicon nitride film is an example of the second interface layer 21.

The silicon nitride film suppresses desorption of the nitrogen (N) from the ferroelectric layer 18, for example, at the time of heat treatment during manufacturing of the memory device. The silicon nitride film serves as a supply source of silicon (Si) to the ferroelectric layer 18, for example, at the time of heat treatment during manufacturing of the memory device.

Next, a titanium nitride layer is formed on the ferroelectric layer 18 by, for example, a sputtering method. The titanium nitride layer is an example of the gate electrode layer 16.

Next, the gate electrode layer 16, the second interface layer 21, the ferroelectric layer 18, and the first interface layer 20 are patterned by a lithography method and a reactive ion etching method.

Next, the source region 12 and the drain region 14 are formed in the single crystal silicon layer. N-type impurities are introduced into the single crystal silicon layer by an ion implantation method. Next, the n-type impurities are activated by heat treatment.

Thereafter, the source line 22, the bit line 24, the first contact plug 26, the second contact plug 28, and the interlayer insulating layer 30 are formed by a known process technique.

The memory device illustrated in FIG. 1 is formed by the above manufacturing method.

Next, functions and effects of the memory device of the first embodiment will be described.

Such a one-transistor memory cell having an MFS structure as illustrated in FIG. 1 is expected to be applied to, for example, a NAND flash memory. Multi-leveling for a memory cell has been advanced in order to increase memory capacity for the NAND flash memory. It is also desired to achieve multi-leveling for a memory cell having a MFS structure.

When the coercive field of a ferroelectric is small, for example, the polarization state disappears due to an electric field generated in the ferroelectric by polarization of the ferroelectric. Thus, when the coercive field of the ferroelectric is small, it is difficult to maintain the polarization state in the ferroelectric. As a result, a large number of polarization states different in level cannot be maintained in the ferroelectric, and it is difficult to achieve multi-leveling for a memory cell.

An increase in the coercive field of the ferroelectric enables stably maintaining of a plurality of polarization states different in level in the memory cell. Therefore, achievement of multi-leveling for the memory cell is facilitated.

The memory device of the first embodiment includes the ferroelectric layer 18 containing the aluminum (Al), the scandium (Sc), the nitrogen (N), and the silicon (Si). The ferroelectric layer 18 contains $(Al_{1-(x+y)}Sc_xSi_y)_pN_q$.

The coercive field of $(Al_{1-(x+y)}Sc_xSi_y)_pN_q$ is about 9 MV/cm. The coercive field of $(Al_{1-(x+y)}Sc_xSi_y)_pN_q$ is, for example, about 1.5 times to about 2 times as large as the coercive field of hafnium oxide as a ferroelectric.

Therefore, the containing of $(Al_{1-(x+y)}Sc_xSi_y)_pN_q$ in the ferroelectric layer 18 facilitates achievement of multi-leveling for the memory cell.

Further, even when $(Al_{1-(x+y)}Sc_xSi_y)_pN_q$ has a thickness of equal to or less than 30 nm, an increase in leakage current is suppressed. For example, when the leakage current of the ferroelectric layer is large, it is difficult to cause polarization inversion of the ferroelectric layer, and thus a memory cell having an MFS structure cannot be achieved.

In the memory device of the first embodiment, the leakage current of the ferroelectric layer 18 is small. Therefore, the memory cell having the MFS structure can be achieved.

For example, unlike $(Al_{1-(x+y)}Sc_xSi_y)_pN_q$, in the case of $(Al_{1-(x+y)}Sc_x)_pN_q$ not containing silicon (Si), leakage current increases when the thickness of $(Al_{1-(x+y)}Sc_x)_pN_q$ is equal to or less than 30 nm, so that it is difficult to achieve a memory cell having an MFS structure.

The reason why the leakage current increases in the case of the $(Al_{1-(x+y)}Sc_x)_pN_q$ not containing silicon (Si) may be due to a large amount of nitrogen deficiency in the film. The reason why the leakage current is reduced in the case of $(Al_{1-(x+y)}Sc_xSi_y)_pN_q$ may be because silicon (Si) has a stronger bond with nitrogen (N) than Al (aluminum) and the amount of nitrogen deficiency in the film is reduced.

When the first interface layer 20 and the second interface layer 21 each containing nitrogen (N) are provided, it is considered that an increase in leakage current is further suppressed due to suppression of desorption of the nitrogen (N) from the ferroelectric layer 18 or supply of the nitrogen (N) to the ferroelectric layer 18. In addition, when the first interface layer 20 and the second interface layer 21 each containing silicon (Si) are provided, it is considered that an increase in leakage current is further suppressed due to suppression of desorption of the silicon (Si) from the ferroelectric layer 18 or supply of the silicon (Si) to the ferroelectric layer 18.

In terms of suppression of the leakage current, the amount of nitrogen deficiency in the film is preferably small. Therefore, the ratio (N/(Al+Sc+Si)) of the atomic concentration of the nitrogen (N) to the sum of the respective atomic concentrations of the aluminum (Al), the scandium (Sc), and the silicon (Si) in the ferroelectric layer 18 is preferably equal to or more than 0.85.

The reason why no ferroelectricity of aluminum nitride (AlN) that is a wurtzite crystal like $(Al_{1-(x+y)}Sc_x)_pN_q$ and $(Al_{1-(x+y)}Sc_xSi_y)_pN_q$ is exhibited may be because the coercive field becomes too large due to a small amount of nitrogen deficiency. That is, it may be because the coercive field becomes too large and exceeds the dielectric breakdown field of the aluminum nitride (AlN) film.

Therefore, in order to exhibit ferroelectricity, it is considered that a certain amount of nitrogen deficiency is required in the film. In the case of $(Al_{1-(x+y)}Sc_x)_pN_q$ and $(Al_{1-(x+y)}Sc_xSi_y)_pN_q$, it is considered that substitution of scandium (Sc) with the aluminum site of aluminum nitride (AlN) causes distortion of the lattice, so that a certain amount of nitrogen deficiency is formed in $(Al_{1-(x+y)}Sc_x)_pN_q$ and $(Al_{1-(x+y)}Sc_xSi_y)_pN_q$. Therefore, it is considered that the coercive field is lowered and ferroelectricity is exhibited.

In terms of exhibition of ferroelectricity, a certain amount of nitrogen deficiency is preferably present. Therefore, the ratio (N/(Al+Sc+Si)) of the atomic concentration of the nitrogen (N) to the sum of the respective atomic concentrations of the aluminum (Al), the scandium (Sc), and the silicon (Si) in the ferroelectric layer 18 is preferably equal to or less than 0.95.

In terms of suppression of the leakage current, the atomic concentration of the silicon (Si) in the ferroelectric layer 18 is preferably equal to or more than 1%, and more preferably equal to or more than 5%.

In terms of scaling-down of the memory device, the thickness of the ferroelectric layer 18 in the direction from the semiconductor layer 10 to the gate electrode layer 16 is preferably equal to or less than 30 nm, more preferably equal to or less than 20 nm, and still more preferably equal to or less than 10 nm.

In terms of suppression of the leakage current of the ferroelectric layer 18, the thickness of the ferroelectric layer 18 in the direction from the semiconductor layer 10 to the gate electrode layer 16 is preferably equal to or more than 1 nm, and more preferably equal to or more than 3 nm.

The direction of the c-axis as the six-fold symmetry axis of the wurtzite crystal contained in the ferroelectric layer 18 preferably falls within a range of ±10 degrees with respect to the direction connecting the semiconductor layer 10 and the gate electrode layer 16. The wurtzite crystal contained in the ferroelectric layer 18 is c-axis oriented, resulting in suppression of the leakage current of the ferroelectric layer 18.

For example, $(Al_{1-(x+y)}Sc_xSi_y)_pN_q$ has a lower relative permittivity than hafnium oxide conventionally applied as a ferroelectric. The relative permittivity of $(Al_{1-(x+y)}Sc_xSi_y)_pN_q$ is about 10, and the relative permittivity of hafnium oxide is about 20. Thus, in application of $(Al_{1-(x+y)}Sc_xSi_y)_pN_q$ to the ferroelectric layer 18, for example, when the memory device includes the first interface layer 20 and the second interface layer 21, the electric field applied to the first interface layer 20 and the second interface layer 21 can be relaxed as compared with application of hafnium oxide. As a result, dielectric breakdown of the first interface layer 20 and the second interface layer 21 is suppressed. Therefore, a highly reliable memory device is achieved.

Further, for example, when the memory device includes the first interface layer 20, an interface dipole between the first interface layer 20 and the ferroelectric layer 18 is hardly formed. Furthermore, when the memory device includes the second interface layer 21, an interface dipole between the second interface layer 21 and the ferroelectric layer 18 is hardly formed.

Such an interface dipole is hardly formed due to a small difference between the relative permittivity of $(Al_{1-(x+y)}Sc_xSi_y)_pN_q$ and the relative permittivity of the first interface layer 20 or a small difference between the relative permittivity of $(Al_{1-(x+y)}Sc_xSi_y)_pN_q$ and the relative permittivity of the second interface layer 21. An interface dipole is hardly formed, so that trapping of charges due to the interface dipole is suppressed. Therefore, a highly reliable memory device is achieved.

First Modification

A memory device of a first modification is different from the memory device of the first embodiment in that a first dielectric layer includes a first region and a second region provided between the first region and a semiconductor layer and the atomic concentration of silicon (Si) in the first region is lower than the atomic concentration of silicon (Si) in the second region.

Figure 2:
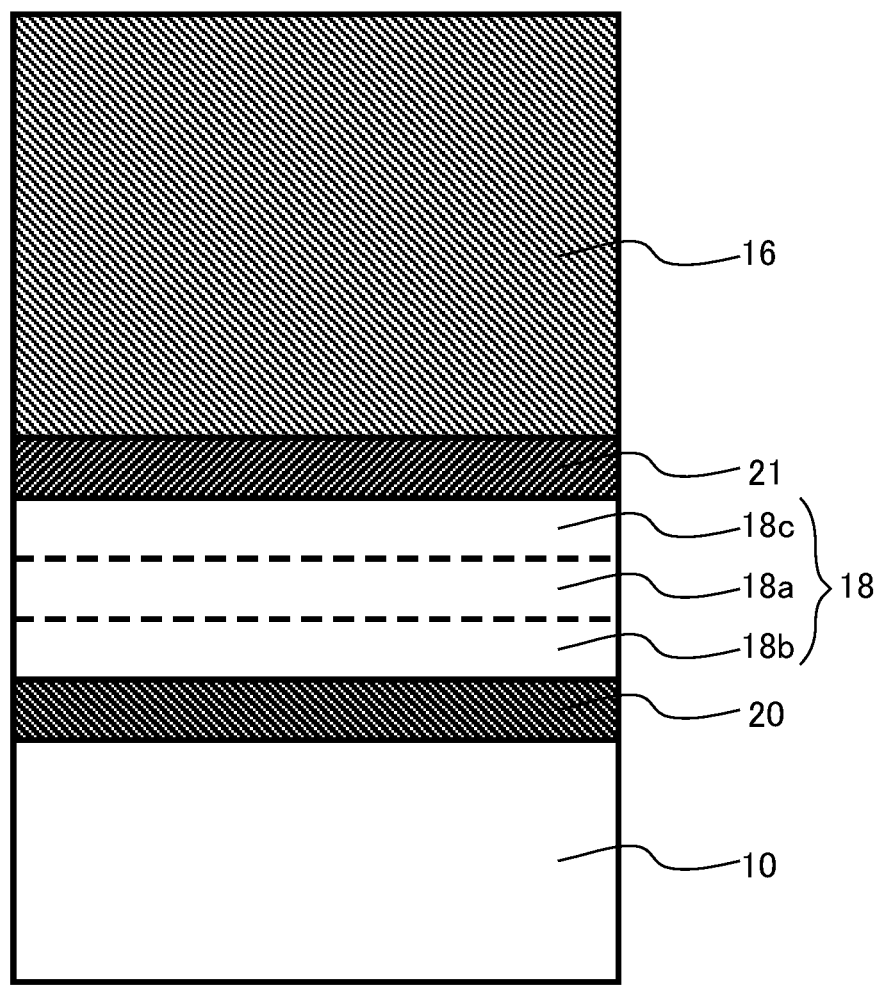
FIG. 2 is a schematic sectional view of a memory device of a first modification of the first embodiment.

FIG. 2 is a schematic sectional view of the memory device of the first modification of the first embodiment. FIG. 2 is an enlarged view of a portion of a metal ferroelectrics semiconductor (MFS) structure.

A ferroelectric layer 18 includes a first region 18a, a second region 18b, and a third region 18c. The second region 18b is provided between a semiconductor layer 10 and the first region 18a. The third region 18c is provided between a gate electrode layer 16 and the first region 18a.

The atomic concentration of silicon (Si) in the first region 18a is lower than the atomic concentration of silicon (Si) in the second region 18b. The atomic concentration of the silicon (Si) in the first region 18a is lower than the atomic concentration of silicon (Si) in the third region 18c.

The atomic concentration of nitrogen (N) in the first region 18a is lower than the atomic concentration of nitrogen (N) in the second region 18b. The atomic concentration of the nitrogen (N) in the first region 18a is lower than the atomic concentration of nitrogen (N) in the third region 18c.

The average grain size of crystals in the first region 18a is larger than the average grain size of crystals in the second region 18b. The average grain size of the crystals in the first region 18a is larger than the average grain size of crystals in the third region 18c.

For example, when there is a difference in the atomic concentration of the nitrogen (N), a difference in the atomic concentration of the silicon (Si), or a difference in the average grain size of the crystals in the ferroelectric layer 18, the change in polarization with respect to the electric field applied to the ferroelectric layer 18 is gentle. Therefore, multi-leveling of a memory cell is further facilitated.

Second Modification

A memory device of a second modification is different from the memory device of the first embodiment in that a ferroelectric layer 18 does not contain silicon (Si). The memory device of the second modification includes a first interface layer 20.

Even when the ferroelectric layer 18 does not contain silicon (Si), the amount of nitrogen deficiency in the ferroelectric layer 18 is suppressed by including the first interface layer 20. Therefore, the leakage current of the ferroelectric layer 18 is suppressed.

The ratio (N/(Al+Sc)) of the atomic concentration of nitrogen (N) to the sum of the respective atomic concentrations of aluminum (Al) and scandium (Sc) in the ferroelectric layer 18 is, for example, equal to or more than 0.85 and equal to or less than 0.95.

In the case of the memory device of the second modification, the first interface layer 20 preferably contains silicon (Si) and nitrogen (N). Note that it is desirable to include a second interface layer 21. When the second interface layer 21 is not provided, it is considered that use of, for example, a conductive layer containing a conductive nitride such as titanium nitride or tungsten nitride as a gate electrode layer 16 results in suppression of desorption of the nitrogen (N) from the ferroelectric layer 18 and suppression of an increase in the leakage current.

As described above, according to the memory devices of the first embodiment and the modifications, providing a ferroelectric having a large coercive field facilitates achievement of multi-leveling.

Second Embodiment

A memory device of a second embodiment includes a stacked body including insulating layers and gate electrode layers alternately stacked in a first direction, a semiconductor layer provided in the stacked body and extending in the first direction, and a first dielectric layer provided between the semiconductor layer and the gate electrode layers. The first dielectric layer contains aluminum (Al), a first element, nitrogen (N), and silicon (Si). The first element is at least one element selected from the group consisting of scandium (Sc), yttrium (Y), lanthanoid (Ln), boron (B), gallium (Ga), and indium (In).

The memory device of the second embodiment is different from the memory device of the first embodiment in that a structure similar to the structure of the memory cell of the first embodiment is applied to a three-dimensional NAND flash memory. For example, a ferroelectric layer is similar to the ferroelectric layer of the first embodiment. Hereinafter, the details of description overlapping with the first embodiment will be partially omitted.

Figure 3:
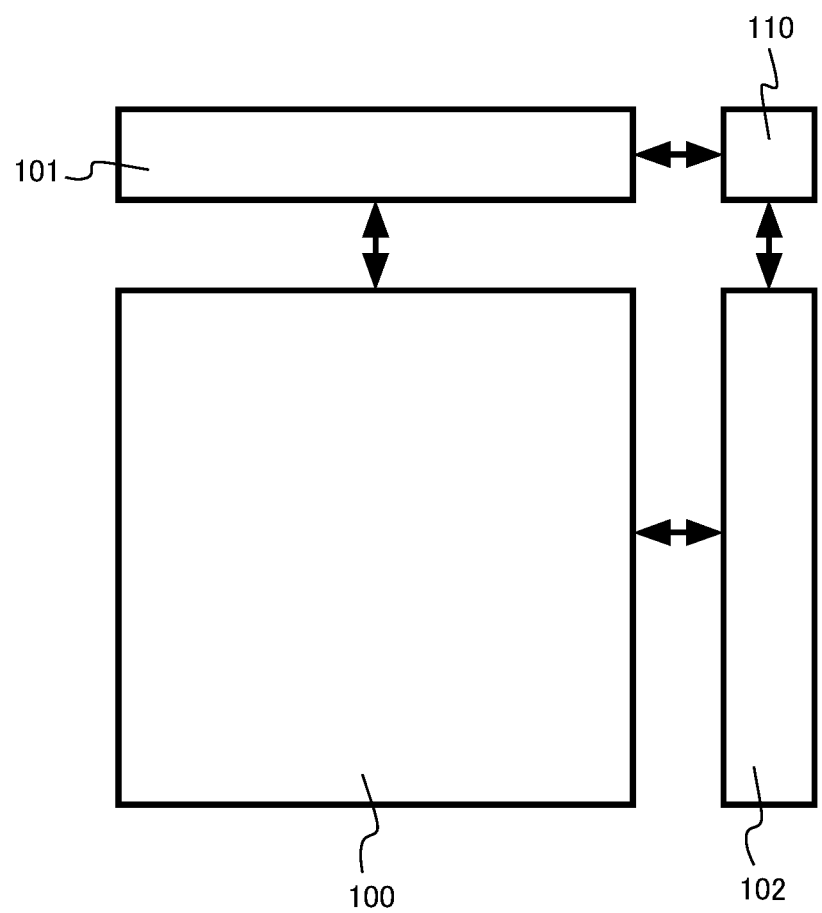
FIG. 3 is a block diagram of a memory device of a second embodiment.
Figure 4:
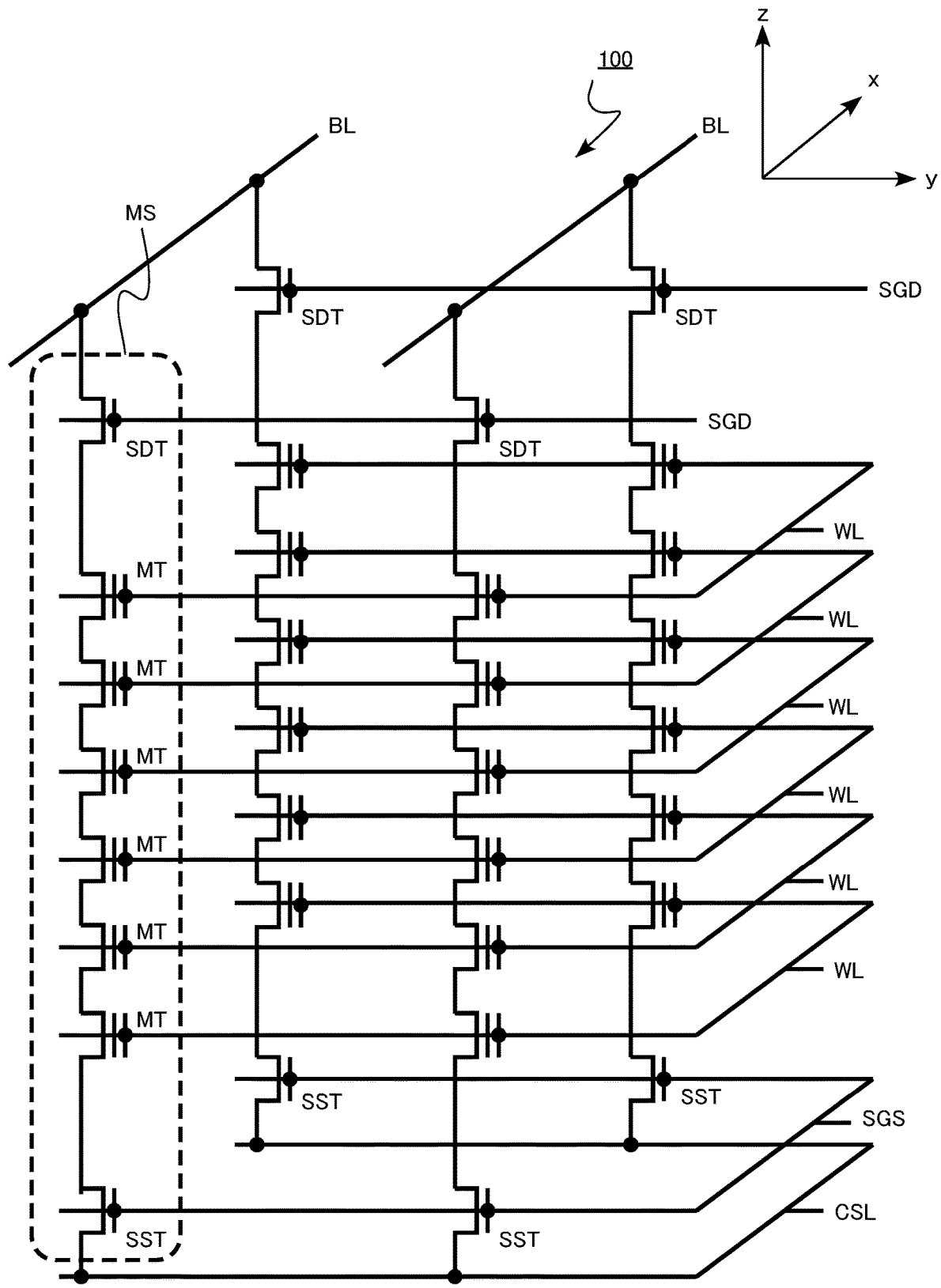
FIG. 4 is a circuit diagram of a memory cell array of the memory device of the second embodiment.
Figure 5:
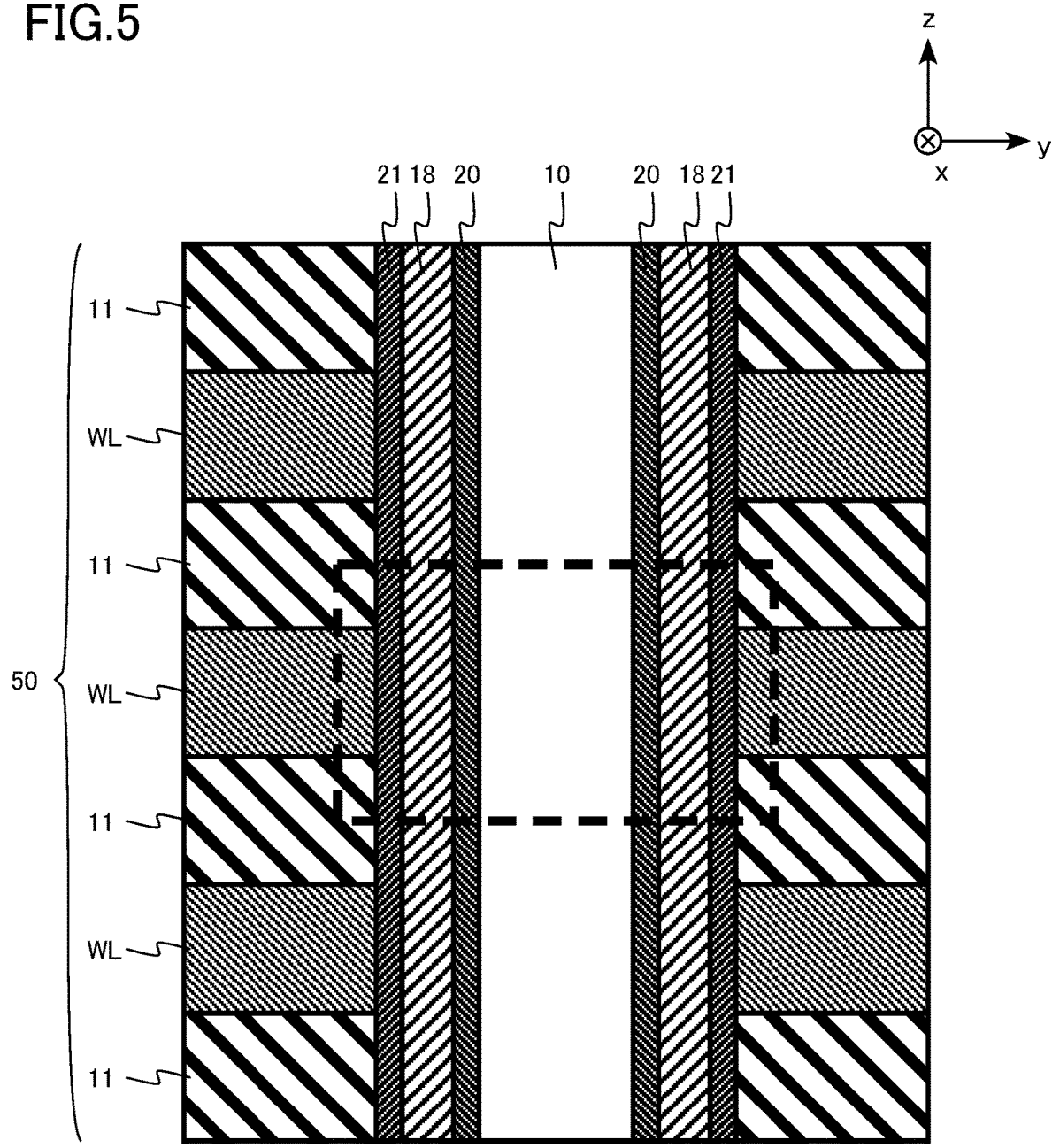
FIG. 5 is a schematic sectional view of a memory string of the memory device of the second embodiment.

FIG. 3 is a block diagram of the memory device of the second embodiment. FIG. 4 is a circuit diagram of a memory cell array of the memory device of the second embodiment. FIG. 5 is a schematic sectional view of a memory string of the memory device according to the second embodiment. FIG. 5 illustrates a section of a plurality of memory cell transistors MT in a single memory string MS in a memory cell array 100 of FIG. 4. In FIG. 5, the region surrounded by a dotted line corresponds to the single memory cell transistor MT.

The three-dimensional NAND flash memory includes the memory cell array 100, a first peripheral circuit 101, a second peripheral circuit 102, and a control circuit 110.

As illustrated in FIG. 4, the memory cell array 100 in the three-dimensional NAND flash memory of the second embodiment includes a plurality of word lines WL, a common source line CSL, a source-selection gate line SGS, a plurality of drain-selection gate lines SGD, a plurality of bit lines BL, and a plurality of memory strings MS. In FIG. 4, the x direction (second direction), the y direction (third direction), and the z direction (first direction) are directions crossing each other, for example, directions orthogonal to each other.

As illustrated in FIG. 4, the memory strings MS each include a source-selection transistor SST, a plurality of memory cell transistors MT, and a drain-selection transistor SDT connected in series between the common source line CSL and the corresponding bit line BL. A single memory string MS is selected though a bit line BL and a drain-selection gate line SGD, and a single memory cell transistor MT can be selected through a word line WL.

As illustrated in FIG. 5, the memory cell array 100 includes the word lines WL, a semiconductor layer 10, a plurality of interlayer insulating layers 11, a ferroelectric layer 18, a first interface layer 20, and a second interface layer 21. The word lines WL and the interlayer insulating layers 11 are included in a stacked body 50.

Each of the word lines WL is an exemplary gate electrode layer. The ferroelectric layer 18 is an exemplary first dielectric layer. The first interface layer 20 is an exemplary second dielectric layer. The second interface layer 21 is an exemplary third dielectric layer.

The word lines WL and the interlayer insulating layers 11 are provided, for example, on a semiconductor substrate (not illustrated).

The word lines WL and the interlayer insulating layers 11 are alternately stacked in the z direction (first direction) on the semiconductor substrate. The word lines WL and the interlayer insulating layers 11 are included in the stacked body 50.

Such a word line WL is a plate-like conductor. The word line WL is, for example, a metal or semiconductor. The word line WL is, for example, tungsten (W). The word line WL may have a stacked structure of titanium nitride and tungsten. The word line WL functions as a control electrode for a memory cell transistor MT.

The interlayer insulating layers 11 each separate a word line WL and a word line WL. The interlayer insulating layers 11 are each, for example, silicon oxide.

The semiconductor layer 10 is provided in the stacked body 50. The semiconductor layer 10 extends in the z direction. The semiconductor layer 10 penetrates the stacked body 50. The semiconductor layer 10 has, for example, a cylindrical shape.

The semiconductor layer 10 is, for example, polycrystalline silicon, polycrystalline silicon germanium, polycrystalline or amorphous indium gallium zinc oxide, or polycrystalline or amorphous zinc tin oxide. The semiconductor layer 10 functions as a channel for a memory cell transistor MT.

The ferroelectric layer 18 is provided between the semiconductor layer 10 and the word lines WL. The ferroelectric layer 18 functions as part of a gate insulating layer.

The ferroelectric layer 18 contains aluminum (Al), a first element, nitrogen (N), and silicon (Si). The first element is at least one element selected from the group consisting of scandium (Sc), yttrium (Y), lanthanoid (Ln), boron (B), gallium (Ga), and indium (In).

The first interface layer 20 is provided between the semiconductor layer 10 and the ferroelectric layer 18. The second interface layer 21 is provided between the ferroelectric layer 18 and the word lines WL.

Each memory cell transistor MT includes the corresponding word line WL, the ferroelectric layer 18, and the semiconductor layer 10. Each memory cell transistor MT has a function of holding data based on the level of the polarization state of the ferroelectric layer 18.

The data held in each memory cell transistor MT is, for example, a threshold voltage of the memory cell transistor MT corresponding to the level of the polarization state of the ferroelectric layer 18. Each memory cell transistor MT is capable of storing, for example, data of two or more bits using different threshold voltages.

Each bit line BL is electrically connected to the corresponding semiconductor layer 10. Each bit line BL has a function of transmitting data read from a memory cell transistor MT. Each bit line BL has a function of transmitting data to be written into a memory cell transistor MT. Each bit line BL is, for example, metal.

Each source-selection transistor SST has a function of selecting the corresponding memory string MS on the basis of a signal given to the source-selection gate line SGS. Each drain-selection transistor SDT has a function of selecting the corresponding memory string MS on the basis of a signal applied to the drain-selection gate line SGD.

For example, a ground potential is applied to the common source line CSL.

The first peripheral circuit 101 is connected to the word lines WL. The first peripheral circuit 101 has a function of selecting a desired word line WL. The first peripheral circuit 101 has a function of applying a commanded voltage to the selected word line WL.

The second peripheral circuit 102 is connected to the bit lines BL. The second peripheral circuit 102 has a function of selecting a desired bit line BL. Further, the second peripheral circuit 102 has a function of sensing the data of the memory cell transistor MT read through the selected bit line BL. Furthermore, the second peripheral circuit 102 has a function of transferring, to the selected bit line BL, data to be written to a memory cell transistor MT. The second peripheral circuit 102 includes, for example, a sense amplifier circuit.

The control circuit 110 controls the operation of the first peripheral circuit 101 and the operation of the second peripheral circuit 102. The control circuit 110 has a function of causing the first peripheral circuit 101 and the second peripheral circuit 102 to execute a write sequence, a read sequence, and an erase sequence for each memory cell transistor MT.

As described above, according to the memory device of the second embodiment, providing a ferroelectric having a large coercive field facilitates achievement of multi-leveling. In addition, the three-dimensional structure enables an increase in the memory capacity of the memory device.

Third Embodiment

A memory device of a third embodiment includes a first electrode, a second electrode, and a first dielectric layer provided between the first electrode and the second electrode. The first dielectric layer contains aluminum (Al), a first element, nitrogen (N), and silicon (Si). The first element is at least one element selected from the group consisting of scandium (Sc), yttrium (Y), lanthanoid (Ln), boron (B), gallium (Ga), and indium (In).

The memory device of the third embodiment is different from the memory device of the first embodiment in that the memory device is a one-transistor one-capacitor type (1T1C type) memory device in which a capacitor including a ferroelectric layer as a capacitor insulating layer and a transistor for memory cell selection are combined. For example, the ferroelectric layer is similar to the ferroelectric layer of the first embodiment. Hereinafter, the details of description overlapping with the first embodiment will be partially omitted.

Figure 6:
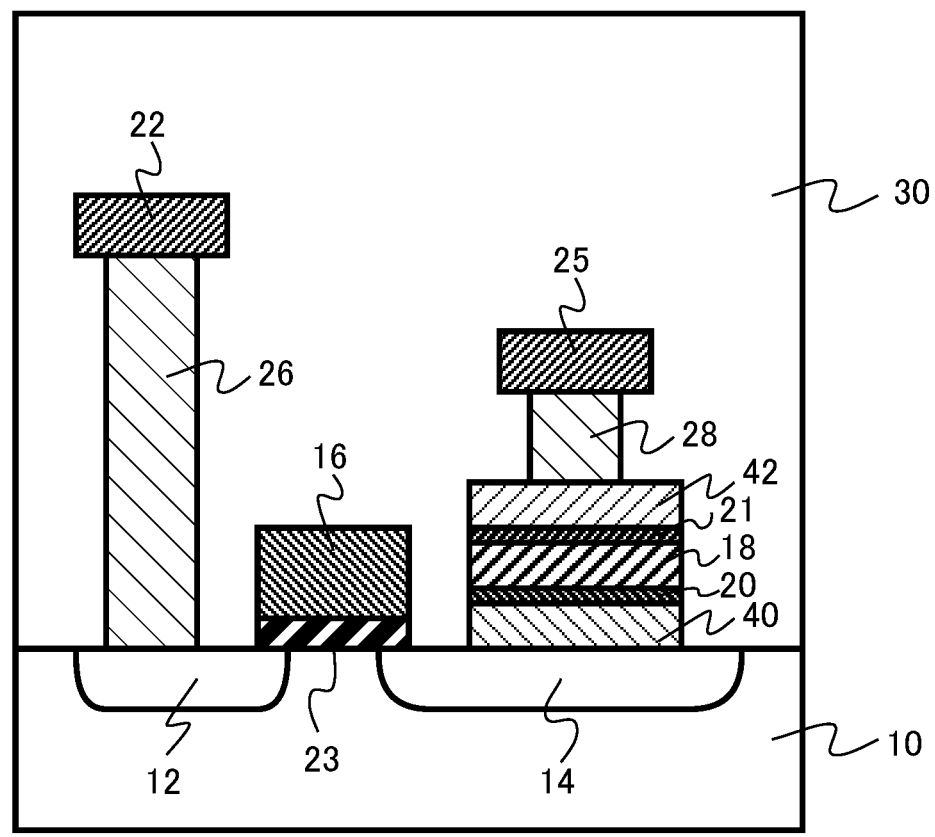
FIG. 6 is a schematic sectional view of a memory device of a third embodiment.

FIG. 6 is a schematic sectional view of the memory device of the third embodiment.

The memory device of the third embodiment includes a semiconductor layer 10, a source region 12, a drain region 14, a gate electrode layer 16, a ferroelectric layer 18, a first interface layer 20, a second interface layer 21, a source line 22, a gate insulating layer 23, a plate line 25, a first contact plug 26, a second contact plug 28, an interlayer insulating layer 30, a lower capacitor electrode 40, and an upper capacitor electrode 42.

The ferroelectric layer 18 is an exemplary first dielectric layer. The first interface layer 20 is an exemplary second dielectric layer. The second interface layer 21 is an exemplary third dielectric layer. The lower capacitor electrode 40 is an exemplary first electrode. The upper capacitor electrode 42 is an exemplary second electrode.

The semiconductor layer 10 is, for example, single crystal silicon.

The source region 12 is provided in the semiconductor layer 10. The source region 12 is an n-type impurity region. The drain region 14 is provided in the semiconductor layer 10. The drain region 14 is an n-type impurity region. The source region 12 and the drain region 14 may be each a p-type impurity region.

The gate electrode layer 16 is a metal or a semiconductor. The gate electrode layer 16 is, for example, titanium nitride. The gate electrode layer 16 is, for example, polycrystalline silicon containing n-type impurities or p-type impurities.

The gate insulating layer 23 is provided between the semiconductor layer 10 and the gate electrode layer 16. The gate insulating layer 23 is, for example, silicon oxide.

The semiconductor layer 10, the gate insulating layer 23, the gate electrode layer 16, the source region 12, and the drain region 14 are included in a transistor for memory cell selection. The gate electrode layer 16 functions as a word line of the memory device.

The ferroelectric layer 18 is provided between the lower capacitor electrode 40 and the upper capacitor electrode 42. The lower capacitor electrode 40, the upper capacitor electrode 42, and the ferroelectric layer 18 are included in a capacitor that stores memory data. The capacitor has a so-called metal/ferroelectrics/metal (MFM) type structure.

The lower capacitor electrode 40 is provided on the drain region 14. The lower capacitor electrode 40 is electrically connected to the drain region 14.

The ferroelectric layer 18 contains aluminum (Al), a first element, nitrogen (N), and silicon (Si). The first element is at least one element selected from the group consisting of scandium (Sc), yttrium (Y), lanthanoid (Ln), boron (B), gallium (Ga), and indium (In).

The first interface layer 20 is provided between the lower capacitor electrode 40 and the ferroelectric layer 18. The second interface layer 21 is provided between the ferroelectric layer 18 and the upper capacitor electrode 42.

The lower capacitor electrode 40 and the upper capacitor electrode 42 are each formed of, for example, a conductive metal or a conductive metal compound. The lower capacitor electrode 40 and the upper capacitor electrode 42 are each, for example, titanium nitride (TiN).

The source line 22 is electrically connected to the source region 12 through the first contact plug 26. The plate line 25 is electrically connected to the upper capacitor electrode 42 through the second contact plug 28. The source line 22, the plate line 25, the first contact plug 26, and the second contact plug 28 are each formed of, for example, a conductive metal or a conductive metal compound.

The interlayer insulating layer 30 is provided for electrically separating the semiconductor layer 10, the gate electrode layer 16, the source line 22, the plate line 25, the first contact plug 26, and the second contact plug 28. The interlayer insulating layer 30 is, for example, silicon oxide.

At the time of writing, the memory device of the third embodiment selects a memory cell through a word line and applies a voltage between the source line 22 and the plate line 25 to change the polarization direction of the ferroelectric layer 18. For example, at the time of reading, a pulse voltage is applied, and "1" or "0" of data is determined on the basis of whether or not an induced current due to polarization inversion flows.

For example, the voltage applied between source line 22 and plate line 25 is controlled such that a ferroelectric maintains four or more polarization states different in level. As a result, achieved can be multi-leveling in which data of a plurality of bits is stored in the ferroelectric layer 18 of the capacitor of the memory cell.

As described above, according to the memory device of the third embodiment, providing a ferroelectric having a large coercive field facilitates achievement of multi-leveling.

Fourth Embodiment

A memory device of a fourth embodiment is different from the memory device of the third embodiment in that the memory device is a ferroelectric tunnel junction (FTJ) memory having an FTJ structure using a ferroelectric. For example, the ferroelectric layer is similar to the ferroelectric layer of the first embodiment. Hereinafter, the details of description overlapping with the first embodiment or the third embodiment will be partially omitted.

Figure 7:
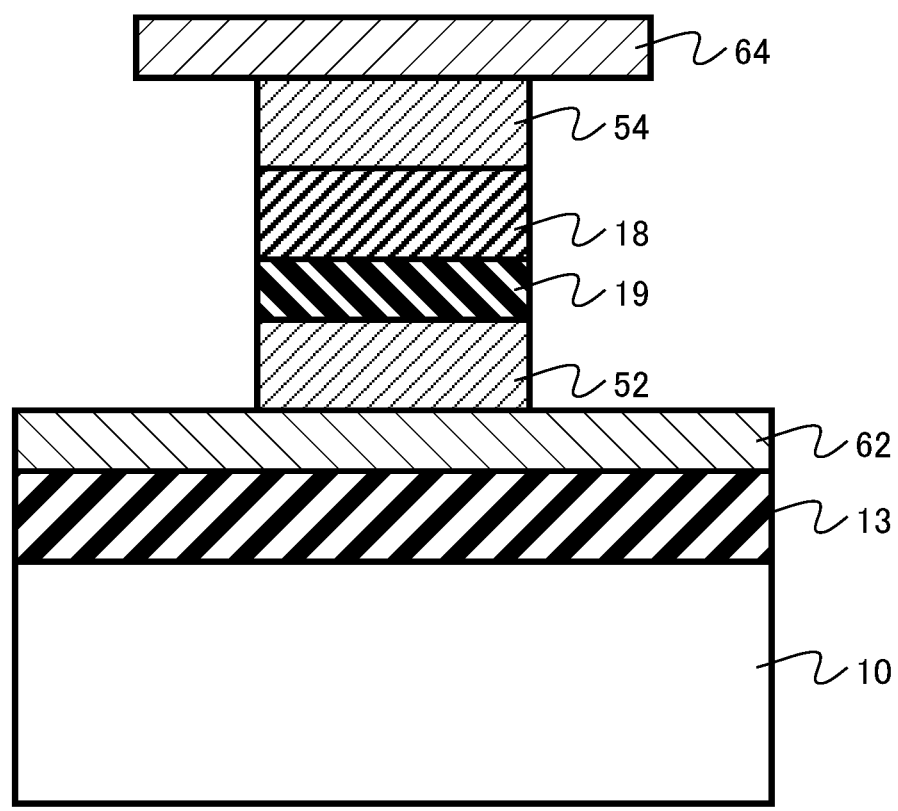
FIG. 7 is a schematic sectional view of the memory device of a fourth embodiment.

FIG. 7 is a schematic sectional view of the memory device of the fourth embodiment.

The memory device of the fourth embodiment includes a semiconductor layer 10, an insulating layer 13, a ferroelectric layer 18, a paraelectric layer 19, a lower electrode 52, an upper electrode 54, a first electrode wiring 62, and a second electrode wiring 64.

The ferroelectric layer 18 is an exemplary first dielectric layer. The lower electrode 52 is an exemplary first electrode. The upper electrode 54 is an exemplary second electrode.

The semiconductor layer 10 is, for example, single crystal silicon.

The insulating layer 13 is provided on the semiconductor layer 10. The insulating layer 13 is, for example, silicon oxide.

The ferroelectric layer 18 is provided between the lower electrode 52 and the upper electrode 54. The paraelectric layer 19 is provided between the lower electrode 52 and the ferroelectric layer 18.

The ferroelectric layer 18 contains aluminum (Al), a first element, nitrogen (N), and silicon (Si). The first element is at least one element selected from the group consisting of scandium (Sc), yttrium (Y), lanthanoid (Ln), boron (B), gallium (Ga), and indium (In).

The paraelectric layer 19 contains a paraelectric. The paraelectric is, for example, oxide, nitride, or oxynitride. The paraelectric is, for example, silicon oxide, silicon nitride, or silicon oxynitride.

The lower electrode 52 and the upper electrode 54 are each formed of, for example, a conductive metal or a conductive metal compound. For example, the lower electrode 52 and the upper electrode 54 are each titanium nitride (TiN).

The first electrode wiring 62 is provided between the insulating layer 13 and the lower electrode 52. The first electrode wiring 62 is in contact with the lower electrode 52. Without the lower electrode 52, part of the first electrode wiring 62 may also serve as the lower electrode 52.

The second electrode wiring 64 is provided on the upper electrode 54. The second electrode wiring 64 is in contact with the upper electrode 54. Without the upper electrode 54, part of the second electrode wiring 64 may also serve as the upper electrode 54.

The FTJ memory includes a two-terminal FTJ structure interposed between the first electrode wiring 62 and the second electrode wiring 64. The FTJ structure functions as a memory cell by using a change in the amount of a tunnel current accompanying polarization inversion of the ferroelectric.

The memory cell is provided in a region where the first electrode wiring 62 and the second electrode wiring 64 cross each other. The FTJ memory of the fourth embodiment has a so-called cross-point structure.

In the FTJ memory of the fourth embodiment, at the time of writing data, a voltage is applied between the first electrode wiring 62 and the second electrode wiring 64 to invert the polarization of the ferroelectric layer 18. At the time of reading data, the data of the memory cell is read as the amount of current flowing between the first electrode wiring 62 and the second electrode wiring 64. The amount of current depending on the polarization direction of the ferroelectric layer 18 is determined, so that the polarity of the data is determined. For example, "0" or "1" of the data is determined.

Because the coercive field of the ferroelectric of the ferroelectric layer 18 is high, the polarization state of the ferroelectric layer 18 is less likely to fluctuate. Therefore, the operation of the FTJ memory is stabilized.

As described above, according to the memory device of the fourth embodiment, a stable operation can be achieved by providing a ferroelectric having a large coercive field.

As a modification of the first and second embodiments, a ferroelectric layer 18 may be applied to a metal ferroelectrics metal insulator semiconductor (MFMIS) structure. A conductive layer is provided between the ferroelectric layer 18 and a semiconductor layer 10, and an insulating layer is provided between the conductive layer and the semiconductor layer 10. The conductive layer is formed of, for example, a conductive metal or a conductive metal compound. Also in this modification, multi-leveling and a stable operation can be achieved by providing a ferroelectric having a large coercive field.

In the first to fourth embodiments and the modifications of the first to fourth embodiments, the case where the first element is scandium (Sc) has been described as an example. However, when the first element is at least one element selected from the group consisting of scandium (Sc), yttrium (Y), lanthanoid (Ln), boron (B), gallium (Ga), and indium (In), functions and effects similar to the functions and effects of the scandium (Sc) can be obtained.

While certain embodiments have been described, these embodiments have been presented by way of example only, and are not intended to limit the scope of the inventions. Indeed, the memory devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A memory device comprising:
a semiconductor layer;
a gate electrode layer; and
a first dielectric layer provided between the semiconductor layer and the gate electrode layer, the first dielectric layer containing aluminum (Al), a first element, nitrogen (N), and silicon (Si), the first element being at least one element selected from the group consisting of scandium (Sc), yttrium (Y), lanthanoid (Ln), boron (B), gallium (Ga), and indium (In), wherein
when the first dielectric layer contains oxygen (O), an atomic concentration of oxygen in the first dielectric layer is lower than an atomic concentration of aluminum (Al) in the first dielectric layer, the atomic concentration of oxygen in the first dielectric layer is lower than an atomic concentration of the first element in the first dielectric layer, the atomic concentration of oxygen in the first dielectric layer is lower than an atomic concentration of nitrogen (N) in the first dielectric layer, and the atomic concentration of oxygen in first dielectric layer is lower than an atomic concentration of silicon (Si) in the first dielectric layer.

2. The memory device according to claim 1, wherein the first dielectric layer has a thickness of equal to or less than 30 nm.

3. The memory device according to claim 1, wherein the atomic concentration of the first element in the first dielectric layer is lower than the atomic concentration of the aluminum (Al) in the first dielectric layer.

4. The memory device according to claim 1, wherein the atomic concentration of the first element in the first dielectric layer is equal to or more than 5% and equal to or less than 20%.

5. The memory device according to claim 1, wherein a ratio of the atomic concentration of the nitrogen (N) in the first dielectric layer to a sum of respective atomic concentrations of the aluminum (Al), the first element, and the silicon (Si) in the first dielectric layer is equal to or more than 0.85 and equal to or less than 0.95.

6. The memory device according to claim 1, wherein the atomic concentration of the silicon (Si) in the first dielectric layer is lower than the atomic concentration of the aluminum (Al) in the first dielectric layer.

7. The memory device according to claim 1, further comprising: a second dielectric layer provided between the semiconductor layer and the first dielectric layer, the second dielectric layer containing at least either silicon (Si) or nitrogen (N).

8. The memory device according to claim 7, wherein a thickness of the second dielectric layer is thinner than a thickness of the first dielectric layer.

9. The memory device according to claim 7, wherein the first dielectric layer includes a first region and a second region provided between the first region and the semiconductor layer, and an atomic concentration of the silicon (Si) in the first region is lower than an atomic concentration of the silicon (Si) in the second region.

10. The memory device according to claim 1, further comprising a third dielectric layer provided between the first dielectric layer and the gate electrode layer, the third dielectric layer containing at least either silicon (Si) or nitrogen (N).

11. The memory device according to claim 1, wherein the first dielectric layer contains a wurtzite type crystal.

12. The memory device according to claim 11, wherein a direction of a c-axis of the wurtzite type crystal falls within a range of +10 degrees with respect to a direction connecting the semiconductor layer and the gate electrode layer.

13. The memory device according to claim 1, wherein the first dielectric layer is a ferroelectric.

14. A memory device comprising:
a semiconductor layer;
a gate electrode layer;
a first dielectric layer provided between the semiconductor layer and the gate electrode layer, the first dielectric layer containing aluminum (Al), a first element, and nitrogen (N), the first element being at least one element selected from the group consisting of scandium (Sc), yttrium (Y), lanthanoid (Ln), boron (B), gallium (Ga), and indium (In); and
a second dielectric layer provided between the semiconductor layer and the first dielectric layer, the second dielectric layer containing at least either silicon (Si) or nitrogen (N). wherein
when the first dielectric layer contains oxygen (O), an atomic concentration of oxygen in the first dielectric layer is lower than an atomic concentration of aluminum (Al) in the first dielectric layer, the atomic concentration of oxygen in the first dielectric layer is lower than an atomic concentration of the first element in the first dielectric layer, and the atomic concentration of oxygen in the first dielectric layer is lower than an atomic concentration of nitrogen (N) in the first dielectric layer.

15. The memory device according to claim 14, wherein the first dielectric layer has a thickness of equal to or less than 30 nm.

16. The memory device according to claim 14, further comprising: a third dielectric layer provided between the first dielectric layer and the gate electrode layer, the third dielectric layer containing at least either silicon (Si) or nitrogen (N).

\* \* \* \* \*